United States Patent
Ranganathan

(10) Patent No.: US 7,282,991 B2
(45) Date of Patent: Oct. 16, 2007

(54) ON-CHIP AMPLIFIER/LINE DRIVER COMPENSATION CIRCUIT

(75) Inventor: Sumant Ranganathan, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/887,869

(22) Filed: Jul. 12, 2004

(65) Prior Publication Data

US 2006/0006936 A1    Jan. 12, 2006

(51) Int. Cl.
*H03F 3/45*    (2006.01)
(52) U.S. Cl. .................. 330/69; 330/307; 330/260
(58) Field of Classification Search .............. 330/69, 330/260, 307
See application file for complete search history.

(56) References Cited

U.S. PATENT DOCUMENTS

| | | | | |
|---|---|---|---|---|
| 3,870,968 A | * | 3/1975 | Vosteen et al. ............. | 330/298 |
| 4,439,693 A | * | 3/1984 | Lucas et al. ................. | 327/95 |
| 4,633,223 A | * | 12/1986 | Senderowicz ............... | 341/118 |
| 5,315,266 A | * | 5/1994 | Lorenz ....................... | 330/294 |
| 5,414,741 A | * | 5/1995 | Johnson ...................... | 375/376 |
| 5,418,492 A | * | 5/1995 | Wang et al. ................ | 330/260 |
| 5,508,570 A | * | 4/1996 | Laber et al. ................ | 327/563 |
| 5,563,612 A | * | 10/1996 | Flood et al. ................ | 342/385 |
| 5,880,634 A | * | 3/1999 | Babanezhad ............... | 330/126 |
| 6,201,442 B1 | * | 3/2001 | James et al. ................ | 330/107 |
| 6,366,099 B1 | * | 4/2002 | Reddi ......................... | 324/678 |
| 6,967,611 B2 | * | 11/2005 | Atriss et al. ................ | 341/172 |

\* cited by examiner

*Primary Examiner*—Patricia Nguyen
(74) *Attorney, Agent, or Firm*—Sterne, Kessler, Goldstein & Fox, P.L.L.C.

(57) ABSTRACT

An embodiment of the present invention includes an amplifier on an integrated circuit, with the amplifier having positive and negative inputs, and positive and negative outputs. A first feedback capacitor is on the integrated circuit between the positive input and the negative output. A second feedback capacitor is on the integrated circuit between the negative input and the positive output. A package encloses the integrated circuit. A third capacitor is between the positive and negative inputs. A feedback factor of the amplifier circuit approaches unity. In example embodiments, the first and second capacitors are between 3 and 10 pF. The third capacitor is between 3 and 10 pF.

22 Claims, 4 Drawing Sheets

ON-CHIP AMPLIFIER/LINE DRIVER COMPENSATION CIRCUIT

BACKGROUND OF THE INVENTION

1. Field of the Invention

The present invention relates to differential line drivers, and more particularly, to low distortion high speed differential drivers.

2. Related Art

Transmit line driver amplifiers typically need to drive a very low ohmic loads and need to be stable and operate with a high linearity in a variety of feedback configurations. These can include pure resistive gain configurations, or configurations with gain and some filtering embedded in the feedback network (see FIG. 1). As shown in FIG. 1, a line driver amplifier configuration includes an amplifier 101 having differential outputs $V_{OP}$, $V_{ON}$ driving a load 103. Differential inputs to the amplifier 101 include $V_{IP}$ and $V_{IN}$, optionally passing through an impedance feedback network 102A, 102B. Note that in FIG. 1, the power supply and ground connections are not shown, since they are outside of the signal path.

To maintain high linearity, the open-loop amplifier bandwidth needs to be kept high, so that the amplifier 101 has a high gain at a given frequency to suppress the open-loop non-linearities in the amplifier 101. In such high bandwidth designs, feedback is important to the stable operation of the line driver. Since the line driver has to support a variety of feedback networks, the amplifier 101 alone is designed and fabricated separately on a chip (without any feedback network). The amplifier 101 inputs $V_{IN}$, $V_{IP}$, outputs $V_{ON}$, $V_{OP}$ and power connections (not shown in FIG. 1) are brought outside the package, to be used on a circuit board in any number of the possible feedback configurations.

The package adds parasitic series resistance $R_p$, series inductance $L_p$, and shunt capacitance $C_p$ (see FIG. 2). FIG. 2 illustrates the conventional packaged amplifier 101. As shown in FIG. 2, the amplifier 101 is packaged within a package 201, which includes various parasitics $R_P$, $L_P$ and $C_P$, shown in FIG. 2 in the form of a lumped model. Note that other models may be used, and actual behavior of the package parasitics typically is more complex than is illustrated in FIG. 2. However, the lumped model of FIG. 2 generally gives a good first-order approximation of package parasitic-behavior.

An example of the impedance network 102 could be a summing junction using resistors. The impedance network 102, in actual use, can vary depending on the package 201, the application, and a number of other factors. Typically, the same amplifier 101 needs to work in multiple configurations, with good stability. Also, it is generally not desirable to restrict a particular application to using a specific package. Alternatively, it may be desirable to use a cheaper package with greater variation of a package parasitics, or with higher package parasitics.

Because of the package parasitics, and depending on the load 103 and the nature of the impedance feedback network 102A, 102B, additional phase loss may be introduced into the feedback path of the amplifier 101. Thus, stability becomes a problem for such high bandwidth amplifiers due to the introduction of additional phase (especially for low closed loop operation). The extra phase loss due to the parasitics limits the bandwidth that can be achieved by the amplifier 101. What this means in practice is that to achieve a certain amount of linearity at a certain frequency, one needs a certain amount of gain to overcome the open loop non-linearities of amplifier 101. As the frequency increases, the gain decreases by 20 dB per decade for a single-pole response. Thus, it is desirable to reach a higher bandwidth (i.e., a higher input signal frequency). The package parasitics also become a bigger problem at higher frequencies.

The $V_{OP}$, $V_{ON}$ outputs of the amplifier 101 have to go through two sets of parasitic elements, apart from the external feedback network 102A, 102B before reaching the $V_{IN}$, $V_{IP}$ terminals of the packaged amplifier 201. This causes significant phase shift at high frequencies and results in instability, which can manifest itself as oscillation, or ringing, resulting in poor or unacceptable performance.

A conventional approach provides an external pin for compensation control for the amplifier 101. Some general-purpose amplifiers have this feature. However, this requires an extra terminal to be brought out to the package 201, which is not desirable, and which can also add board noise back into the chip.

Accordingly, there is a need in the art for a line driver/amplifier that operates at high frequencies with a high degree of linearity.

SUMMARY OF THE INVENTION

The present invention is directed to an on-chip amplifier/line driver compensation circuit that substantially obviates one or more of the problems and disadvantages of the related art.

An embodiment of the present invention includes an amplifier on an integrated circuit, with the amplifier having positive and negative inputs, and positive and negative outputs. A first feedback capacitor is on the integrated circuit between the positive input and the negative output. A second feedback capacitor is on the integrated circuit between the negative input and the positive output. A package encloses the integrated circuit. A third capacitor is between the positive and negative inputs. In one embodiment, a feedback factor of the amplifier circuit approaches unity. In example embodiments, the first and second capacitors are between 3 and 10 pF, and the third capacitor is between 3 and 10 pF.

Additional features and advantages of the invention will be set forth in the description that follows, and in part will be apparent from the description, or may be learned by practice of the invention. The advantages of the invention will be realized and attained by the structure and particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to illustrate exemplary embodiments of the invention and are incorporated in and constitute a part of this specification, illustrate embodiments of the invention and together with the description serve to explain the principles of the invention. In the drawings.

DETAILED DESCRIPTION OF EMBODIMENTS OF THE INVENTION

Reference will now be made in detail to the embodiments of the present invention, examples of which are illustrated in the accompanying drawings.

Figure 1:
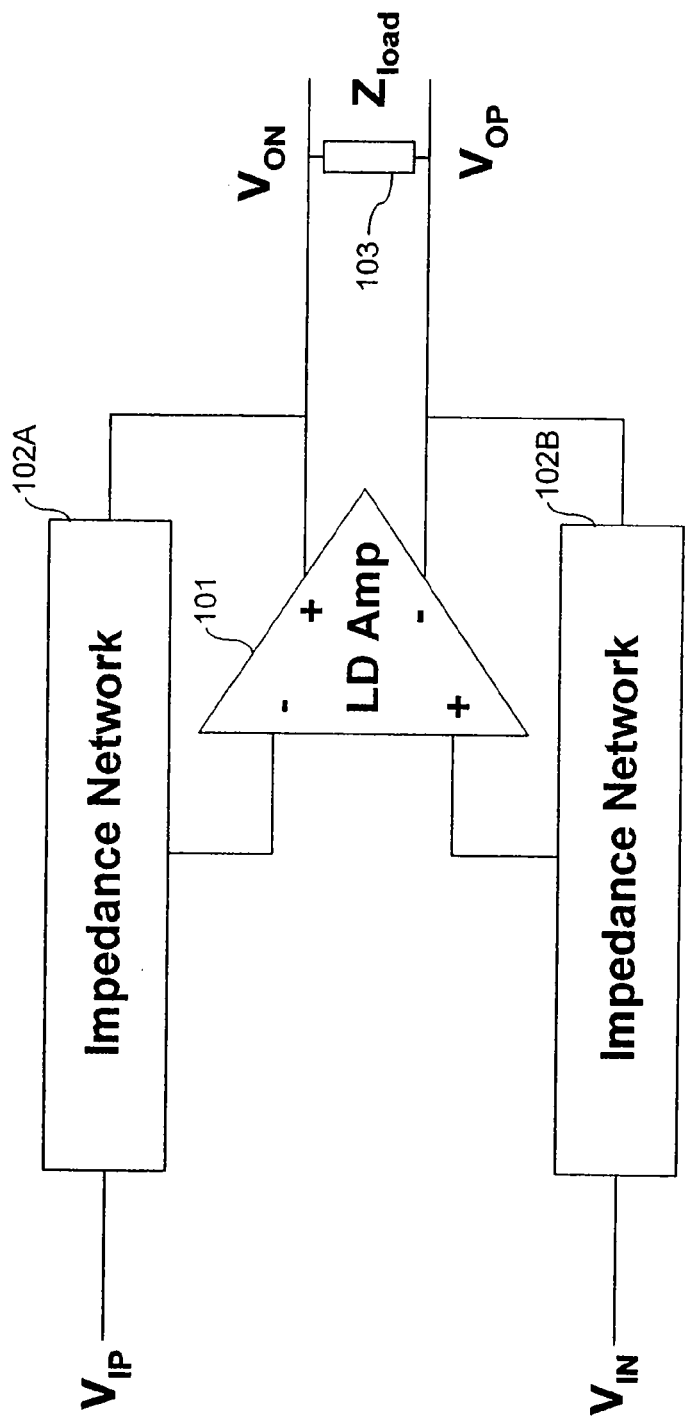
FIG. 1 shows a conventional amplifier/line driver.
Figure 2:
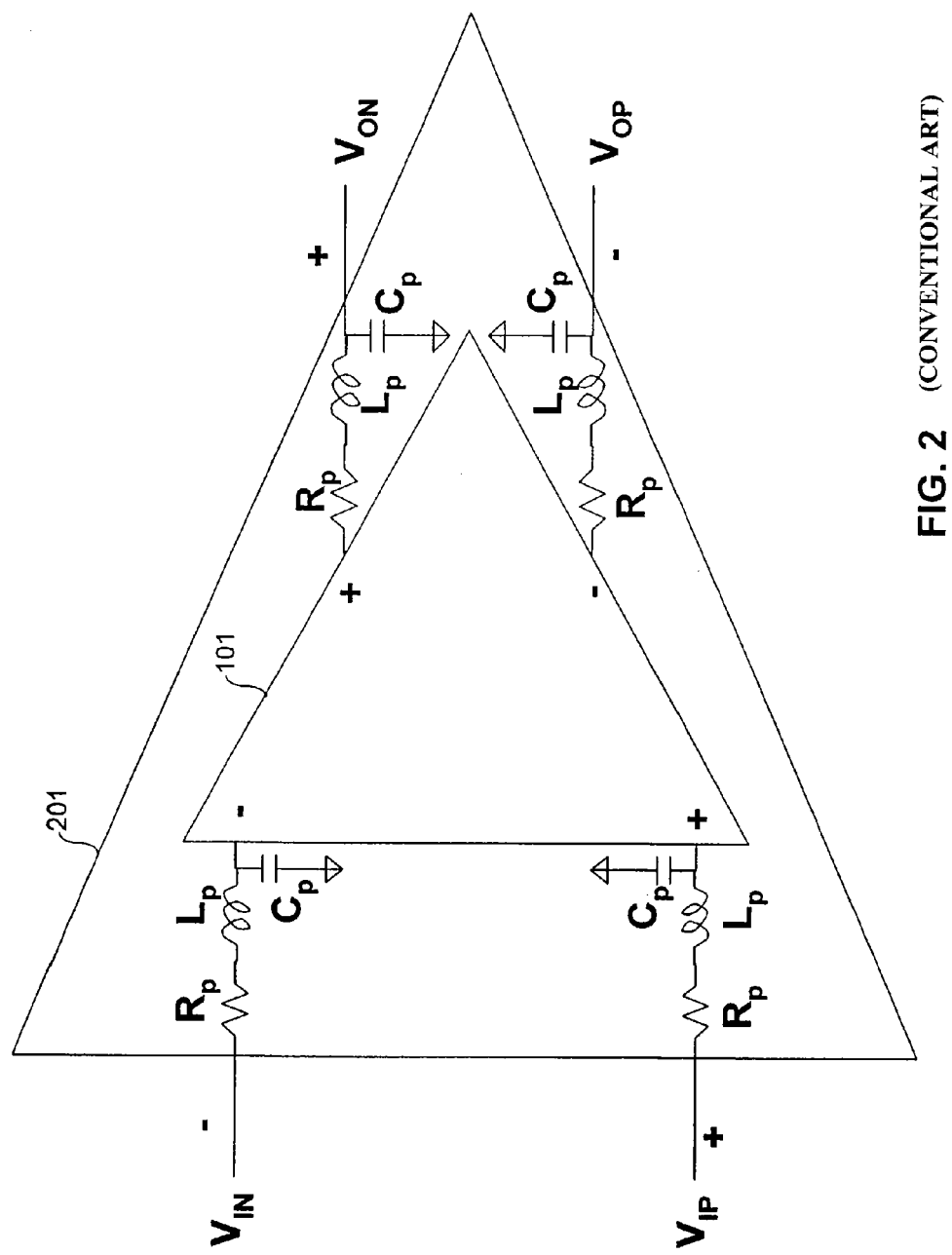
FIG. 2 shows a packaged conventional amplifier/line driver.
Figure 3:
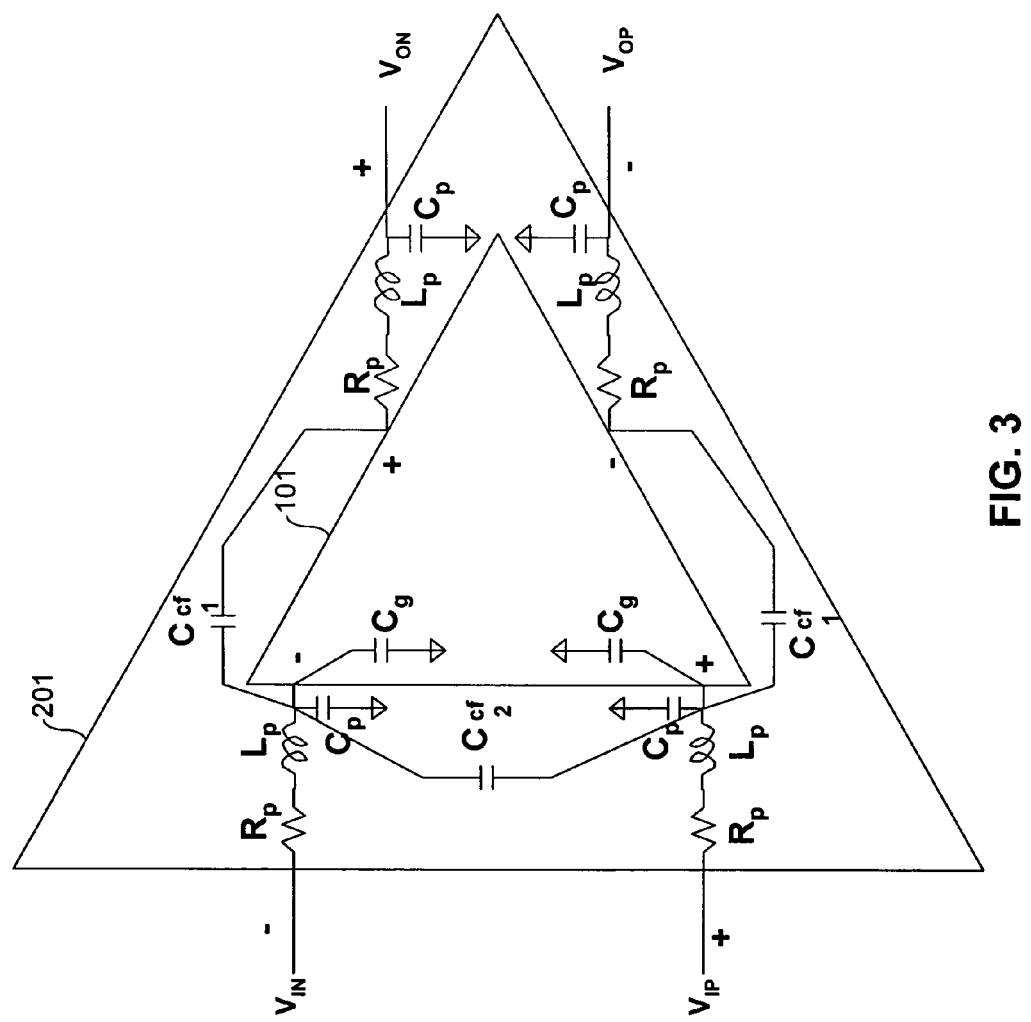
FIG. 3 shows an amplifier of the present invention.

FIG. 3 illustrates one embodiment of the present invention. As shown in FIG. 3, an amplifier 101 is packaged within a package 201. Outputs $V_{ON}$, $V_{OP}$ are shown with the lumped parasitics $R_P$, $L_P$ and $C_P$. Inputs $V_{IN}$, $V_{IP}$ are also shown with the lumped parasitics $R_P$, $L_P$, $C_P$. $C_g$ is the input capacitance of the amplifier 101, which is a known value for a given amplifier 101. In order to provide the appropriate phase response at the desired frequency of operation, feedback capacitances $C_{cf1}$ and $C_{cf2}$ have been added to the amplifier chip. These added feedback capacitors serve to keep a feedback factor of the amplifier 101 appropriate for high frequency operation. Thus, the amplifier 101 is stable in a closed loop configuration even when the values of the parasitic impedances are high. Note that one of the advantages of the approach described above is that the capacitors $C_{cf1}$, $C_{cf2}$ can be added on the amplifier chip itself, removing the need for any external pin outs, or additional components on the printed circuit board. Also, note that the capacitor $C_{cf2}$ is optional.

In a typical application, at a high frequency, it is desirable to have at least 60° of phase margin in any feedback system, and preferably at least 70° of phase margin. Generally, a phase margin of 45° or less implies unstable operation at that frequency.

The feedback factor between the input and output is a fraction. When the fraction approaches 1, the amplifier 101 is said to be operating in unity gain. In that case, the + and − outputs of the amplifier 101 ($V_{ON}$, $V_{OP}$) are effectively directly connected to the inputs $V_{IN}$, $V_{IP}$.

Note further that without the feedback capacitors $C_{cf1}$, $C_{cf2}$, at high frequencies, there may be almost no feedback at all, which means that the amplifier 101, if configured for unity gain operation, would not be stable. The addition of the feedback capacitors $C_{cf1}$, $C_{cf2}$ allows maintaining the feedback factor at high frequencies. Typical numbers for $C_{cf1}$ are in the range of a few pF, although the exact value depends on the application and the feedback factor desired. For example, $C_{cf1}$ may be 5 to 10 pF, or 3 to 7 pF. $C_{cf1}$ could be even less for a very small amplifier, but for line driver applications, where amplifiers tend to be large, 3 to 10 pF is typical.

Typical values for $C_g$ are design-specific, but are normally in the range of a few pF. Typical values for $C_{cf2}$ are also a few pF, but usually smaller than $C_{cf1}$, and depend on the feedback factor $ff_{in}$ (see equation below) that is desired to be achieved, and whether the designer is comfortable with the stability of the amplifier 101. For example, for small feedback factors (e.g., 1/10, or 1/5) the amplifier 101 is stable. On the other hand, at higher feedback factors (near 1, i.e., unity gain configuration), stability may be compromised. A designer will choose $C_{cf1}$, $C_{cf2}$ for a feedback factor $ff_{in}$ with a corresponding gain where he is comfortable that the amplifier 101 will be stable. Typically, a designer will try to keep the amplifier stable for a feedback factor $ff_{in}$ as close to unity as possible. Another constraint is the presence of an external feedback (such as throughout a resistor network). A designer may choose to have the internal feedback that is comparable to the external feedback.

Although a single $C_{cf2}$ capacitor is shown in FIG. 3, two capacitors to ground may be used instead from the positive and negative inputs $V_{IN}+$, $V_{IN}-$, such that the value of each such capacitor is one half of the value of $C_{cf2}$. Also, $C_{cf1}$ can be split into two "parts" ($C_{cf2}$ connected between the positive and negative inputs as shown), and the two additional capacitors to ground (similar to the parasitic capacitors $C_p$).

Local high frequency feedback is thus provided inside the actual amplifier 101 to help compensate the amplifier 101, so that the phase lag at high frequencies in external feedback path does not affect stability. This is achieved using feedback capacitors $C_{cf1}$, $C_{cf2}$ as shown in FIG. 3. The feedback factor $ff_{in}$ for this high frequency loop can be designed to maintain the amplifier 101 in a stable operating region, irrespective of the outside feedback loop.

The feedback factor (which in the innermost loop without the package parasitics is:

$$ff_{in} = \frac{C_{cf1}}{C_{cf1} + 2 * C_{cf2} + C_p + C_g}$$

$C_g$ is the input capacitance of the amplifier 101. For a given package $C_p$ is known, so $C_{cf1}$, $C_{cf2}$ can be chosen to set the desired high frequency feedback factor $ff_{in}$ that will keep the amplifier 101 stable. In some cases $C_{cf2}$ may not be required. It is therefore possible to keep the open loop bandwidth of the amplifier 101 very high, without worrying about stability issues due to feedback through package parasitics. This allows for a high linearity design of the amplifier 101.

Figure 4:
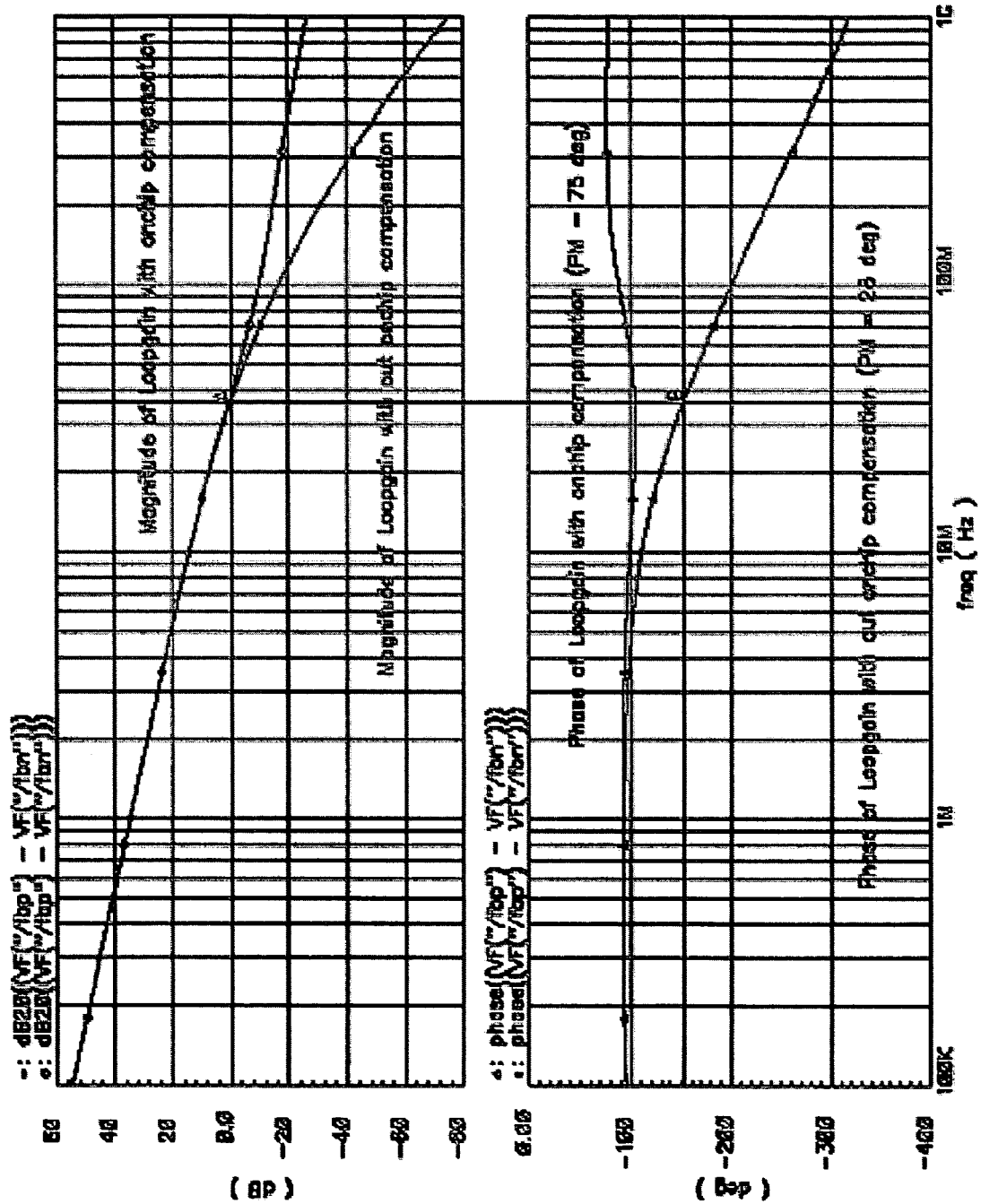
FIG. 4 shows performance of an amplifier both with and without the present invention.

FIG. 4 shows performance of an amplifier both with and without the present invention. In the upper graph, the higher curve shows open loop gain (in dB) of the amplifier 101 with the capacitors of the present invention added, while the lower curve shows the same amplifier 101 without them. Note the visible improvement at higher frequencies. The lower graph shows phase response of the amplifier 101 with the capacitors of the present invention added, while the lower curve shows the same amplifier 101 without them. Note the visible improvement in phase response at higher frequencies.

Although the description above is in terms of a differential amplifier, the invention is also applicable to a single ended amplifier, in substantially the same manner.

CONCLUSION

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. An integrated circuit comprising:
   an amplifier with positive and negative inputs, and positive and negative outputs;
   a first feedback capacitor between the positive input and the negative output;
   a second feedback capacitor between the negative input and the positive output; and
   a package enclosing the amplifier and first and second feedback capacitors to improve the phase and the loop gain magnitude response of the integrated circuit.

2. The integrated circuit of claim 1, further including a third capacitor between the positive input and ground, and a fourth capacitor between the negative input and the ground.

3. The integrated circuit of claim 1, further including a third capacitor between the positive and negative inputs.

4. The integrated circuit of claim 3, wherein the second capacitor is between 3 and 10 pF.

5. The integrated circuit of claim 1, wherein the first capacitor is between 3 and 10 pF.

6. The integrated circuit of claim 1, wherein the first capacitor is between 5 and 10 pF.

7. The integrated circuit of claim 1, wherein the first capacitor is between 3 and 7 pF.

8. A packaged line driver comprising:
an integrated circuit including:
a differential amplifier having positive and negative inputs, and positive and negative outputs,
a first capacitor on the integrated circuit between the positive input and the negative output,
a second capacitor on the integrated circuit between the negative input and the positive output; and
a package enclosing the amplifier and the first and second capacitors to improve the phase and magnitude response of the integrated circuit.

9. The packaged line driver of claim 8, further including a third capacitor between the positive input and ground, and a fourth capacitor between the negative input and the ground.

10. The packaged line driver of claim 8, further including a third capacitor between the positive and negative inputs.

11. The packaged line driver of claim 10, wherein the second capacitor is between 3 and 10 pF.

12. The packaged line driver of claim 8, wherein the first capacitor is between 3 and 10 pF.

13. The packaged line driver of claim 8, wherein the first capacitor is between 5 and 10 pF.

14. The packaged line driver of claim 8, wherein the first capacitor is between 3 and 7 pF.

15. An integrated circuit comprising:
an amplifier with positive and negative inputs, and a single ended output;
a first feedback capacitor between the single ended output and the negative input;
a second feedback capacitor between the negative input and ground; and
a package enclosing the amplifier and first and second feedback capacitors to improve the phase and the loop gain magnitude response of the integrated circuit.

16. The integrated circuit of claim 15, wherein the second capacitor is between 3 and 10 pF.

17. The integrated circuit of claim 15, wherein the first capacitor is between 3 and 10 pF.

18. The integrated circuit of claim 15, wherein the first capacitor is between 5 and 10 pF.

19. The integrated of claim 15, wherein the first capacitor is between 3 and 7 pF.

20. An amplifier circuit comprising:
an integrated circuit including an amplifier having positive and negative inputs, and positive and negative outputs;
a first feedback capacitor on the integrated circuit between the positive input and the negative output;
a second feedback capacitor on the integrated circuit between the negative input and the positive output; and
a third capacitor between the positive and negative inputs;
wherein the integrated circuit is mounted within a package, and
wherein a feedback factor of the amplifier circuit is defined by $$ff_{in} = \frac{C_{cf1}}{C_{cf1} + 2*C_{cf2} + C_p + C_g}$$

where $C_g$ is an input capacitance of the amplifier, $C_{cf1}$ is a capacitance value of the first capacitor, $C_{cf2}$ is the capacitance value of the second capacitor, and $C_p$ is a parasitic capacitance.

21. A packaged line driver comprising:
an integrated circuit including:
a differential amplifier having positive and negative inputs, and positive and negative outputs,
a first capacitor on the integrated circuit between the positive input and the negative output;
a second capacitor on the integrated circuit between the negative input and the positive output; and
a third capacitor between the positive and negative inputs;
wherein the integrated circuit is mounted within a package, and
wherein a feedback factor of the line driver is defined by $$ff_{in} = \frac{C_{cf1}}{C_{cf1} + 2*C_{cf2} + C_p + C_g}$$

where $C_g$ is an input capacitance of the differential amplifier, $C_{cf1}$ is a capacitance value of the first capacitor, $C_{cf2}$ is the capacitance value of the second capacitor, and $C_p$ is a parasitic capacitance.

22. An amplifier circuit comprising:
an integrated circuit including a amplifier having positive and negative inputs, and a single ended output;
a first feedback capacitor on the integrated circuit between the single ended output and the negative input; and
a second feedback capacitor on the integrated circuit between the negative input and ground;
wherein the integrated circuit is mounted within a package, and
wherein a feedback factor of the amplifier circuit is defined by $$ff_{in} = \frac{C_{cf1}}{C_{cf1} + 2*C_{cf2} + C_p + C_g}$$

where $C_g$ is an input capacitance of the amplifier, $C_{cf1}$ is a capacitance value of the first capacitor, $C_{cf2}$ is the capacitance value of the second capacitor, and $C_p$ is a parasitic capacitance.

* * * * *